(12) United States Patent
Li et al.

(10) Patent No.: US 11,703,693 B2
(45) Date of Patent: Jul. 18, 2023

(54) ARRAY SUBSTRATE AND MANUFACTURING METHOD THEREOF, THREE-DIMENSIONAL DISPLAY PANEL AND DISPLAY DEVICE

(71) Applicant: BOE TECHNOLOGY GROUP CO., LTD., Beijing (CN)

(72) Inventors: Xiaohu Li, Beijing (CN); Huajie Yan, Beijing (CN); Qingyu Huang, Beijing (CN); Yongfeng Zhang, Beijing (CN); Xiaoyun Liu, Beijing (CN); Zhiqiang Jiao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 427 days.

(21) Appl. No.: 16/860,733

(22) Filed: Apr. 28, 2020

(65) Prior Publication Data

US 2021/0157164 A1 May 27, 2021

(30) Foreign Application Priority Data

Nov. 21, 2019 (CN) .......................... 201911146226.1

(51) Int. Cl.
*G02B 30/27* (2020.01)
*H10K 50/844* (2023.01)
(Continued)

(52) U.S. Cl.
CPC ........... *G02B 30/27* (2020.01); *H10K 50/844* (2023.02); *H10K 50/858* (2023.02);
(Continued)

(58) Field of Classification Search
CPC ............ H01L 27/3246; H01L 51/5253; H01L 51/5275; H01L 51/56; H01L 2227/323;
(Continued)

(56) References Cited

U.S. PATENT DOCUMENTS

2014/0246653 A1 11/2014 Wu
2015/0341623 A1* 11/2015 Kim ...................... G02B 30/27
348/59
(Continued)

FOREIGN PATENT DOCUMENTS

CN         102629009 A     8/2012
CN         107844209 A     3/2018
(Continued)

OTHER PUBLICATIONS

First Office Action for CN Patent Application No. 201911146226.1 dated Nov. 2, 2021.

*Primary Examiner* — Kevin Quarterman
(74) *Attorney, Agent, or Firm* — Xsensus LLP (57) ABSTRACT

The present disclosure relates to an array substrate, a manufacturing method thereof, a three-dimensional display panel, and a display device. The array substrate includes a plurality of sub-pixels arranged in an array. Each sub-pixel includes a first composite region and a second composite region alternately arranged, as well as a substrate; a partition portion formed in the second composite region; a pixel electrode including a first composite electrode formed in the first composite region and a second composite electrode formed on the partition portion; an organic light emitting layer formed on a side of the pixel electrode away from the substrate; a pixel defining layer formed on the substrate provided around the organic light emitting layer; a common electrode having a polarity opposite to the pixel electrode formed on a side of organic light emitting layer away from the substrate; and a packaging layer.

16 Claims, 8 Drawing Sheets

(51) Int. Cl.
  *H10K 50/858* (2023.01)
  *H10K 59/122* (2023.01)
  *H10K 71/00* (2023.01)
  *H10K 59/12* (2023.01)
  *H10K 102/00* (2023.01)

(52) U.S. Cl.
  CPC ........... *H10K 59/122* (2023.02); *H10K 71/00* (2023.02); *H10K 59/1201* (2023.02); *H10K 2102/351* (2023.02)

(58) Field of Classification Search
  CPC ........... H01L 2251/558; H01L 27/3258; H01L 27/3262; G02B 30/27
  See application file for complete search history.

(56) References Cited

U.S. PATENT DOCUMENTS

| | | | | |
|---|---|---|---|---|
| 2017/0110519 | A1* | 4/2017 | Hsu | H01L 27/3209 |
| 2019/0196189 | A1* | 6/2019 | Kim | G02B 27/0103 |

FOREIGN PATENT DOCUMENTS

| | | |
|---|---|---|
| CN | 109686768 A | 4/2019 |
| CN | 109713014 A | 5/2019 |
| CN | 109888127 A | 6/2019 |

* cited by examiner

ARRAY SUBSTRATE AND MANUFACTURING METHOD THEREOF, THREE-DIMENSIONAL DISPLAY PANEL AND DISPLAY DEVICE

CROSS-REFERENCE TO RELATED APPLICATION

This application is based upon and claims priority to Chinese Patent Application No. 201911146226.1, filed Nov. 21, 2019, the contents of which being incorporated by reference in their entirety herein.

TECHNICAL FIELD

The present disclosure relates to the field of display technology and, in particular, to an array substrate, a method for manufacturing the array substrate, a three-dimensional display panel, and a display device.

BACKGROUND

A 3D display refers to a three-dimensional stereoscopic display. Compared with an ordinary 2D display, a 3D display is more three-dimensional and lifelike, which provides the audience with an immersive feel. In particular, the demand for 3D technology in the home entertainment and gaming industry has soared.

Naked-eye 3D technology is one of the main technologies of 3D display. It realizes stereo imaging by directly projecting different images to two eyes of a person through a display panel, and has high requirements for the technical level of directional projection of images. Compared with the traditional glasses-type 3D technology, there is no need to wear glasses, the experience is better, and it has good development prospects.

Presently, the main problems of naked-eye 3D technology are the small amount of information (small number of views), the small 3D viewing angle, and the low pixel density, which limit its application in organic light-emitting diode (OLED) display panels.

It should be noted that the information disclosed in the background section above is merely for enhancement of understanding of the background of the present invention and thus, may include information that does not constitute prior art known to one of ordinary skill in the art.

SUMMARY

The purpose of this application is to provide an array substrate, a method for manufacturing the array substrate, a three-dimensional display panel, and a display device.

A first aspect of the present application provides an array substrate including a plurality of sub-pixels arranged in an array; each of the sub-pixels includes a first composite region and a second composite region which are arranged alternately, and each of the sub-pixels include:

a substrate;

a partition portion formed on the substrate and located in the second composite region;

a pixel electrode including a first composite electrode formed on the substrate and located in a first composite region, and a second composite electrode formed on a side of the partition portion away from the substrate; the first composite electrode and the second composite electrode are disconnected from each other, and orthographic projections of the first composite electrode and the second composite electrode on the substrate are seamlessly connected;

an organic light emitting layer formed on a side of the pixel electrode away from the substrate;

a pixel defining layer formed on the substrate and provided around the organic light emitting layer;

a common electrode formed on a side of the organic light emitting layer away from the substrate; and a packaging layer formed on a side of the common electrode away from the substrate.

A second aspect of the present application provides an array substrate manufacturing method. The array substrate includes a plurality of sub-pixels arranged in an array; each of the sub-pixels includes a first composite region and a second composite region which are arranged alternately, where the method includes:

providing a substrate;

forming a partition portion on the substrate, the partition portion being located in the second composite region;

forming a pixel electrode, the pixel electrode including a first composite electrode formed on the substrate and located in a first composite region, and a second composite electrode formed on a side of the partition portion away from the substrate; the first composite electrode and the second composite electrode being disconnected from each other, and orthographic projections of the first composite electrode and the second composite electrode on the substrate are seamlessly connected;

forming a pixel defining layer having a pixel opening on the substrate;

forming an organic light emitting layer on a side of the pixel electrode away from the substrate, the organic light emitting layer being located in the pixel opening;

forming a common electrode on a side of the organic light emitting layer away from the substrate; and forming a packaging layer on a side of the common electrode away from the substrate.

A third aspect of the present application provides a three-dimensional display panel, including:

the array substrate according to any one of the foregoing;

a lens array layer formed on a side of the packaging layer away from the array substrate, where the lens array layer includes a plurality of lenses, each of the lenses corresponds to one of the sub-pixels; and the lens array layer is configured to project a left-eye image and a right-eye image displayed by the array substrate onto left and right eyes of a viewer, respectively.

A fourth aspect of the present application provides a display device including the three-dimensional display panel described above.

It should be understood that the above general description and the following detailed description are merely illustrative and explanatory and cannot be construed as a limit to the present invention.

BRIEF DESCRIPTION OF THE DRAWINGS

The accompanying drawings, which are incorporated in the specification and constitute a part of the specification, show the embodiments in accordance with the present invention, and are used to interpret the principle of the present invention together with the description. It is apparent that the drawings in the following description are only some embodiments of the present invention, from which, other drawings may be obtained by those ordinary skilled in the art without paying any creative labor.

DETAILED DESCRIPTION

Exemplary embodiments will now be described more fully with reference to the accompanying drawings. However, the exemplary embodiments may be embodied in many forms and should not be construed as limited to the method of implementation set forth herein. Rather, these embodiments are provided so that this invention will be thorough and complete, and will fully convey the concept of the exemplary embodiments to those skilled in the art. The same reference numerals in the drawings represent the same or similar parts, so the detailed description thereof will be omitted.

Figure 1:
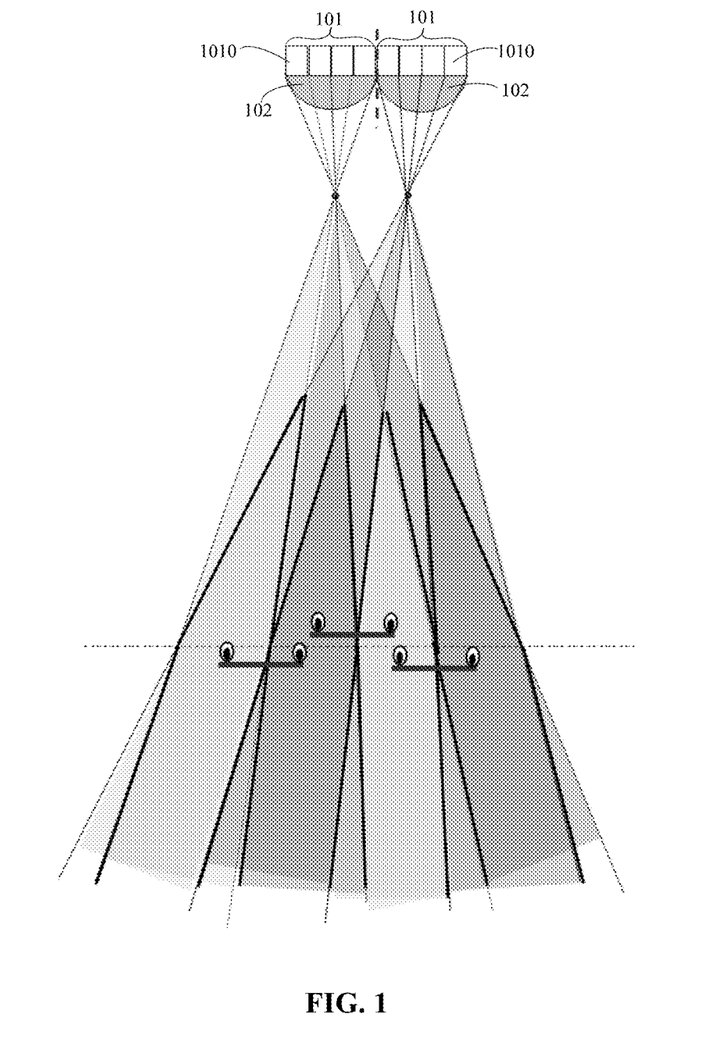
FIG. 1 shows a display principle diagram of a three-dimensional display panel.

The reason why the human brain can sense a three-dimensional stereoscopic image is mainly because the light from an external object enters the two eyes of the person from left and right two different angles, and is analyzed and synthesized by the brain. In order to achieve a naked-eye 3D display, a lens array layer is usually added to the array substrate. Specifically, as shown in FIG. 1, each sub-pixel 101 on the array substrate may correspond to a lens 102 in the lens array layer. Each lens 102 refracts the light emitted by the corresponding sub-pixel 101 to refract different display contents to different places in space. The displayed contents are separated when they reach the human eye, and the human eye receives two images with parallax, thereby creating a three-dimensional effect.

Herein, each sub-pixel may be equivalent to one viewpoint, and the entire panel has a small number of viewpoints and a small viewing angle, and an observer may observe a 3D picture only within a very limited range. At the same time, because the sub-pixels are separated by a pixel-defining layer, the 3D viewing angle may be limited, so it is difficult to meet the requirements of high PPI (pixel density) display panels.

Figure 2:
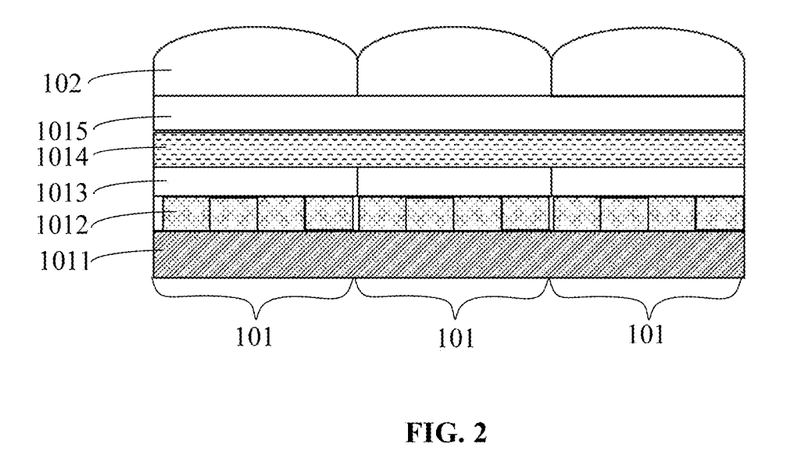
FIG. 2 is a schematic structural diagram of a three-dimensional display panel in the related art.

In the related art, in order to realize an array substrate with a high PPI display, as shown in FIG. 1, each sub-pixel 101 in the array substrate is divided into a plurality of composite pixels 1010. Specifically, as shown in FIG. 2, pixel electrodes 1010 in the sub-pixel 101 are divided into multiple composite electrodes 1012 which are arranged in the same layer, and each composite electrode 1012 is independently driven and controlled by different thin film transistors so that the corresponding light-emitting layer 1013 above each composite electrode 1012 emits light, thereby realizing the requirement of high PPI display. It should be noted that each sub-pixel in FIG. 2 further includes a base substrate 1011, a common electrode 1014, and a packaging layer 1015. Also, it should be noted that the base substrate 1011, the common electrode 1014, and the packaging layer 1015 are provided on the entire surface.

It should also be understood that, in order to prevent the composite pixels 1010 from interfering with each other in their respective operation, the composite pixels 1010 are usually provided at intervals. Generally, the composite electrodes 1012 between the composite pixels 1010 may be provided at intervals. However, due to the certain spacing between composite pixels 1010, when this array substrate is applied to a three-dimensional display panel, a 3D display failure may be caused.

In order to solve the above problem, an embodiment of the present application proposes an array substrate. The array substrate may improve the 3D display effect while achieving high PPI display.

The array substrate according to an embodiment of the present application will be described in detail below with reference to the drawings.

Figure 3:
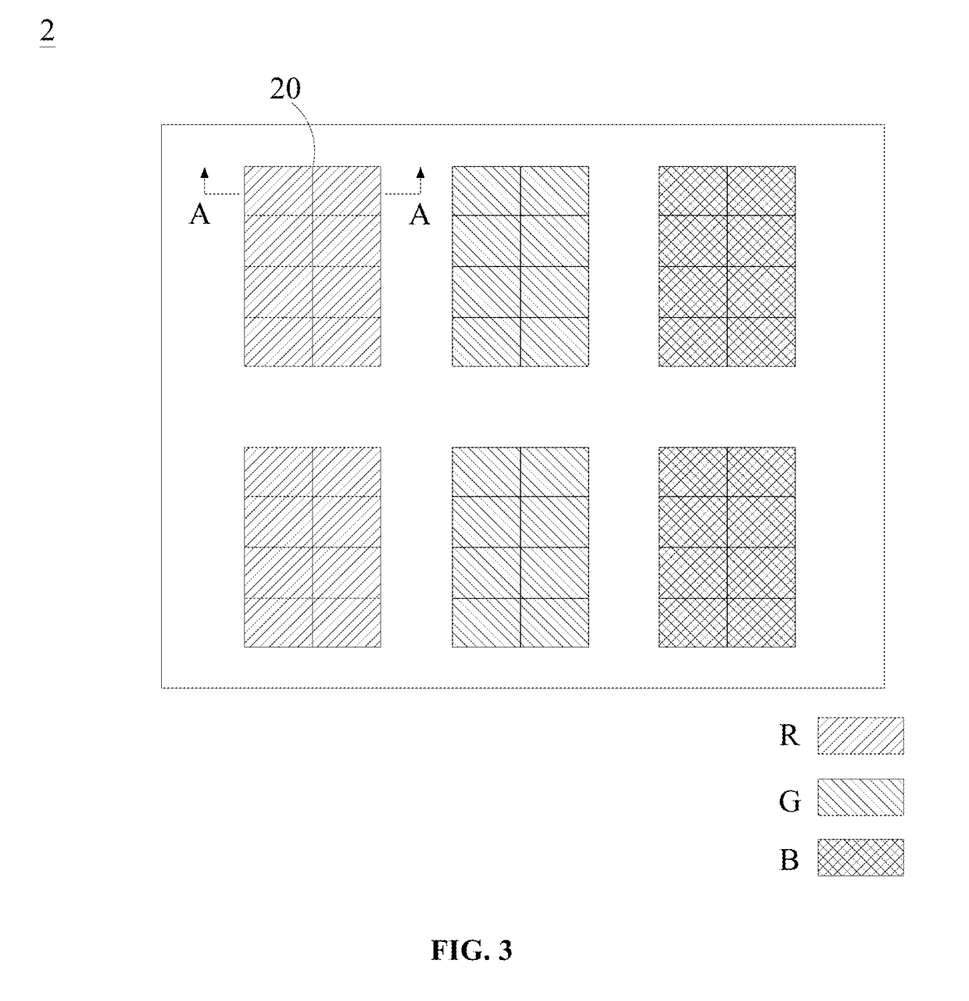
FIG. 3 is a schematic plan view of an array substrate according to an embodiment of the present application.
Figure 4:
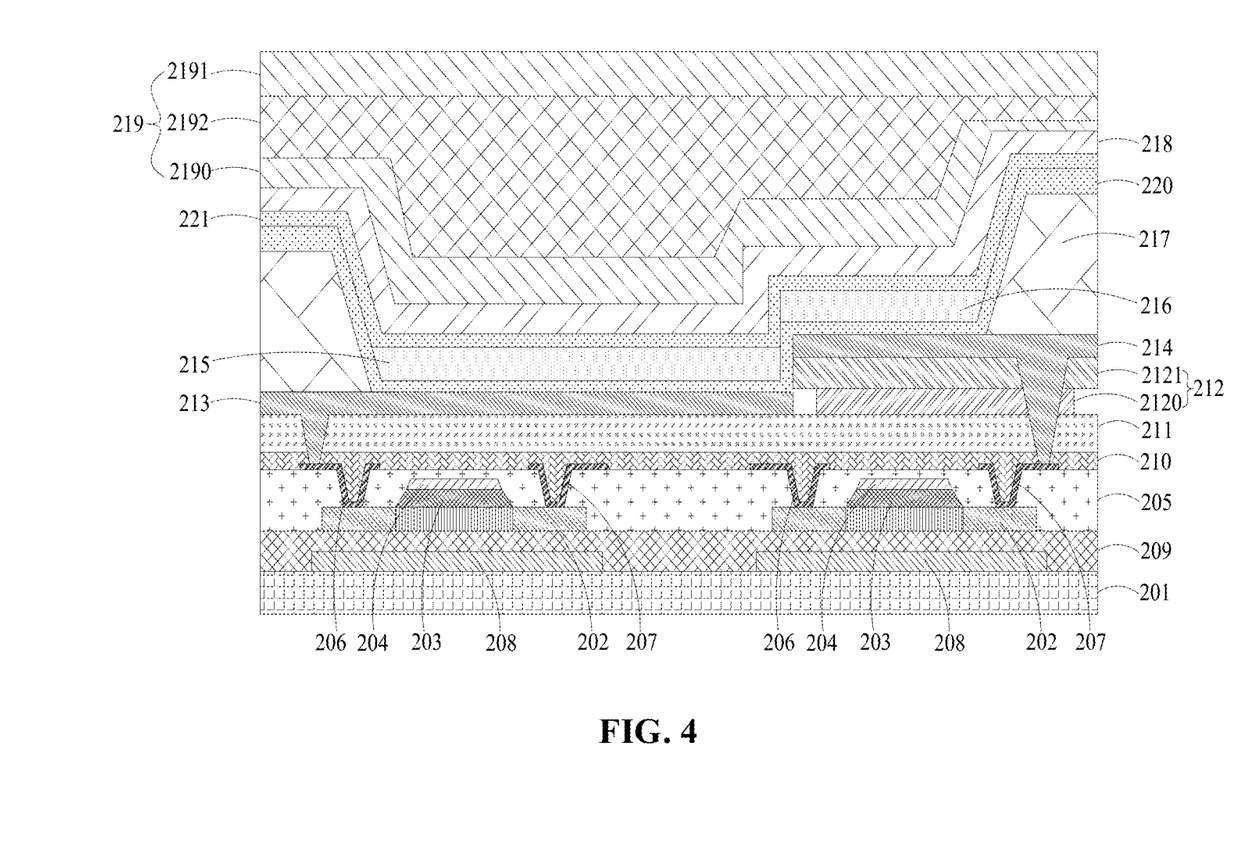
FIG. 4 shows a schematic cross-sectional view in the A-A direction shown in FIG. 3.

As shown in FIG. 3, the array substrate 2 of this embodiment may include a plurality of sub-pixels 20 arranged in an array. For example, the plurality of sub-pixels 20 may include R sub-pixels, G sub-pixels, and B sub-pixels, but is not limited thereto, and may also include white light sub-pixels and the like. In this embodiment, each sub-pixel 20 may include a first composite area and a second composite area that are alternately arranged. It should be noted that the first composite area and the second composite area are seamlessly connected. In detail, as shown in FIG. 4, each sub-pixel 20 includes a substrate, a partition portion 212, a pixel electrode, an organic light emitting layer, a pixel defining layer 217, a common electrode 218, and a packaging layer 219.

In an embodiment, the substrate may include a base layer 201 and a driving circuit layer formed on the base layer 201. For example, the base layer 201 may be made of glass materials such as soda-lime glass, quartz glass, and sapphire glass, but is not limited to this, and may also be made of other inorganic or organic materials, which depends on specific needs. The driving circuit layer may include a plurality of thin film transistors, and the thin film transistor may include an active layer 202, a gate insulating layer 203, a gate 204, an interlayer insulating layer 205, a source electrode 206, and a drain electrode 207. The thin film transistor may be an LTPS-TFT (low temperature polysilicon-thin film transistor) or an oxide-TFT (oxide-thin film transistor), for example, IGZO-TFT, which is not limited in this application. It should be noted that the thin film transistor of this embodiment is not limited to a bottom gate type, and may also be a top gate type, which depends on the specific situation. In addition, it should be understood that the driving circuit layer may further include other circuit structures, such as a capacitor.

In addition, the substrate may further include a light shielding (LS) layer, a buffer layer 209, a passivation layer 210, and a flat layer 211. The light shielding layer 208 may be provided on the base layer 201, and the buffer layer 209 is provided on the base layer 201 and is configured to cover the light shielding layer 208. The light-shielding layer 208 corresponds to the active layer 202, and the light-shielding layer 208 is configured to block light incident on the channel region of the active layer 202. For example, the light shielding layer 208 may be made of a metal material, but is not limited thereto. The passivation layer 210 is formed on the base layer 201 and covers the source electrode 206 and the drain electrode 207. The flat layer 211 is formed on a side of the passivation layer 210 away from the substrate layer 201.

The partition portion 212 is formed on the substrate and located in the second composite region. For example, the orthographic projection of the partition portion 212 on the substrate may completely overlap the second composite region.

The pixel electrode may serve as an anode of the sub-pixel 20, and the pixel electrode may include a first composite electrode 213 and a second composite electrode 214. The first composite electrode 213 is formed on the substrate and located in the first composite area. For example, the first composite electrode 213 is directly formed on the substrate, and the orthographic projection of the first composite electrode 213 on the substrate may completely overlap the first composite region. The second composite electrode 214 is formed on the side of the partition portion 212 away from the substrate, that is, the second composite electrode 214 is indirectly formed on the substrate through the partition portion 212. Due to the partition portion 212, the second composite electrode 214 and the first composite electrode 213 are disconnected from each other. In addition, since the aforementioned partition portion 212 is located in the second composite region, the second composite electrode 214 is also located in the second composite region. For example, the orthographic projection of the second composite electrode 214 on the substrate may completely overlap the orthographic projection of the partition portion 212 on the substrate, that is, the orthographic projection of the first composite electrode 213 on the substrate may completely overlap the orthographic projection of the second composite electrode 214 on the substrate.

It should be noted that, because the first composite electrode 213 and the second composite electrode 214 are disconnected from each other in the pixel electrode, the first composite electrode 213 and the second composite electrode 214 need to be electrically connected to different thin film transistors, that is, the first composite electrode 213 and the second composite electrode 214 are independently controlled. For example, the first composite electrode 213 and the second composite electrode 214 may be electrically connected to an output terminal (the output terminal is usually a drain) of the thin film transistor. In addition, the first composite electrode 213 and the second composite electrode 214 may be made of indium tin oxide material, but it is not limited thereto, and may be made of other materials. The pixel electrode may be made by vacuum sputtering or vacuum evaporation, but it is not limited thereto.

The organic light emitting layer is formed on a side of the pixel electrode away from the substrate. The organic light emitting layer may be made by vacuum evaporation or inkjet printing, but it is not limited thereto. It should be understood that the orthographic projection of the organic light-emitting layer on the substrate covers the first composite electrode 213 and the second composite electrode 214, that is, the first composite electrode 213 and the second composite electrode 214 may respectively control their corresponding parts in the organic light-emitting layer to emit light. Specifically, the organic light emitting layer may include a first composite light emitting portion 215 and a second composite light emitting portion 216. The first composite light emitting portion 215 is formed on a side of the first composite electrode 213 away from the array substrate 2. The second composite light emitting portion 216 is formed on a side of the second composite electrode 214 away from the substrate.

It should be noted that the light emission colors of the first composite light emitting portion 215 and the second composite light emitting portion 216 in the same sub-pixel 20 may be the same, so that each sub-pixel 20 may correspond to an opening area in the evaporation mask plate. Therefore, the accuracy requirement of the evaporation mask plate may be reduced, and the cost may be reduced.

The pixel defining layer 217 is formed on the substrate and is provided around the organic light emitting layer, avoiding the occurrence of cross-colors of adjacent sub-pixels 20.

The common electrode 218 may be used as the cathode of the sub-pixel 20, and the common electrode 218 may be formed on the side of the organic light emitting layer away from the substrate. The common electrode 218 may be formed by a vacuum evaporation method, but is not limited thereto. It should be noted that the common electrode 218 is provided on the entire surface, that is, this electrode may be shared by the first composite light emitting portion 215 and the second composite light emitting portion 216. In addition, the common electrode 218 may be also shared by each sub-pixel 20, such a design may reduce costs. For example, the common electrode 218 may be made of metal material (for example, aluminum, silver), metal alloy material (for example, a magnesium-silver alloy), or indium tin oxide material. In this way, the work function or contact potential of the common electrode 218 may be guaranteed to avoid the break of the common electrode 218.

The packaging layer 219 may be formed on a side of the common electrode 218 away from the substrate for packaging the organic light emitting layer. The packaging layer 219 may have a one-layer structure or a multi-layer structure, and a material thereof may be inorganic material, organic material, or a combination of inorganic material and organic material.

For example, the packaging layer 219 may include a first inorganic packaging film 2190, a second inorganic packaging film 2191, and an organic packaging film 2912 provided between the first inorganic packaging film 2190 and the second inorganic packaging film 2191. The multi-layer of inorganic packaging films may improve the ability of the packaging layer 219 to block water and oxygen, and the organic packaging film 2912 may be provided to achieve planarization.

The first inorganic packaging film 2190 and the second inorganic packaging film 2191 may be made of inorganic material such as silicon nitride (SiN), but is not limited thereto. The first inorganic packaging film 2190 and the second inorganic packaging film 2191 may be prepared by using PECVD (Plasma Enhanced Chemical Vapor Deposition) or ALD (Atomic Layer Deposition). The organic packaging film 2912 may be made of organic materials that may be cured (this curing includes light curing or thermal curing). Specifically, the organic packaging film 2912 may be made of at least one of epoxy-based organic material, acrylate-based organic material, and organic silicon material. The aforementioned organic packaging film 2912 may be prepared by using an IJP (Ink Jet Printing) process or screen printing.

Based on the above structure, in this embodiment, by providing the partition portion 212 in the sub-pixel 20, the pixel electrodes in the sub-pixel 20 may be divided into a plurality of disconnected composite electrodes. Since the plurality of composite electrodes are disconnected from each other, the sub-pixel 20 may be divided into multiple composite pixels, so that a high PPI (Pixels Per Inch) display may be realized. In addition, due to the setting of the partition portion 212, mutual disconnection may be realized between multiple composite electrodes while maintaining the orthographic projection of each composite electrode on the substrate to be connected in a seamless lay. That is, the orthographic projections of multiple composite pixels on the substrate may be maintained to be seamless, so as to improve the 3D display effect.

Figure 5:
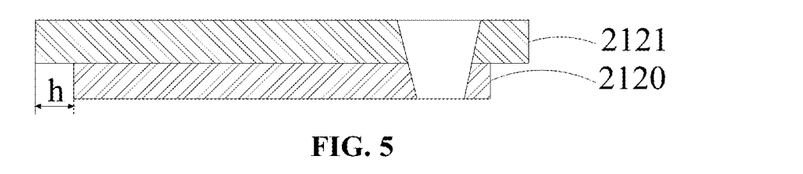
FIG. 5 is a schematic cross-sectional view of a partition portion of an array substrate according to an embodiment of the present application.

In an alternative embodiment, the partition portion 212 may include a first partition layer 2120 and a second partition layer 2121 sequentially stacked on the substrate; the orthographic projection of the first partition layer 2120 on the substrate is located in the center area of the orthographic projection of the second partition layer 2121 on the substrate. In other words, the cross-sectional shape of the partition portion 212 may be a T-shape as shown in FIG. 4 and FIG. 5. Since the edge of the first partition layer 2120 is retracted inwardly compared to the edge of the second partition layer 2121, that is, a recess is formed in the edge of the partition portion 212 near the substrate; accordingly, when the pixel electrode is manufactured, the pixel electrode material cannot be formed as a film at the recess, so that the pixel electrode material is naturally disconnected here, so as to form the first composite electrode 213 and the second composite electrode 214 mutually disconnected from each other. There is no need to perform a patterning process, such as exposure, development, etching, to the pixel electrodes in sub-pixel 20, thereby improving the production efficiency of the first composite electrode 213 and the second composite electrode 214.

Optionally, as shown in FIG. 5, the distance h between the edge of the first partition layer 2120 and the edge of the second partition layer 2121 is 1 µm to 5 µm. In this embodiment, the distance between the edge of the first partition layer 2120 and the edge of the second partition layer 2121 is controlled to be not less than 1 µm, so as to form the first composite electrode 213 and the second composite electrode 214 that are disconnected from each other at one time. In addition, the edge of the first partition layer 2120 and the edge of the second partition layer 2121 is controlled to be not less than 5 µm, so as to ensure the contact area between the partition portion 212 and the substrate, thereby ensuring the structural stability of the partition portion 212, and avoiding the situation where the partition portion 212 and the second composite electrode 214 on the partition portion 212 are prone to peel.

In an embodiment, in order to produce the T-shaped partition portion 212, when the first partition layer 2120 and the second partition layer 2121 are manufactured, materials with different etching rates may be used. Specifically, the first partition layer 2120 may be made of material with a high etching rate, and the second partition layer 2121 may be made of material with a low etching rate. That is, the etching rate of the first partition layer 2120 is higher than that of the second partition layer 2121. In this way, the first partition layer 2120 and the second partition layer 2121 may be etched at the same time under the same etching conditions, so that the T-shaped partition portion 212 may be formed, thereby reducing the difficulty of manufacturing the partition portion 212.

For example, the first partition layer 2120 may be made of material such as metal and resin; and the second partition layer 2121 may be made of inorganic material such as silicon oxide and silicon nitride. Such design makes the etching selection ratio of the first partition layer 2120 and the second partition layer 2121 is relatively high, so as to form the partition portion 212 having a T-shaped cross section as a whole.

Optionally, the thickness of the first partition layer 2120 may be 50 nm to 1500 nm; the thickness of the second partition layer 2121 may be 30 nm to 1500 nm, that is, the thickness of the partition portion 212 may be 80 nm to 3000 nm. Such design can avoid the partition portion 212 from being too thin that the first composite electrode 213 and the second composite electrode 214 cannot be disconnected from each other. At the same time, the common electrode 218 can be prevented from being broken due to the over-thickness of partition 212.

In addition, by controlling the thickness of the partition portion 212 within the above range, it is also possible to ensure that the first composite light emitting portion 215 and the second composite light emitting portion 216 are disconnected from each other, which reduces the risk of interference between the composite pixels in the sub-pixel 20, thereby further improving the display effect. It should be understood that the orthographic projection of the first composite light emitting portion 215 on the substrate and the orthographic projection of the second composite light emitting portion 216 on the substrate are seamlessly connected, that is, a seamless display of the sub-pixels 20 in the light emitting direction is realized.

It should be noted that the organic light emitting functional layer in the sub-pixel 20 of this embodiment includes not only the organic light emitting layer, but also a common layer. The common layer may include at least a hole transport layer 220 (HTL) and an electron transport layer 221 (ETL). The hole transport layer 220 is located between the pixel electrode and the organic light emitting layer, and the electrode transport layer is located between the organic light emitting layer and the common electrode 218, so as to improve the light emitting efficiency of the sub-pixel 20. It should be noted that the common layer of each sub-pixel 20 in the array substrate 2 may be shared.

Figure 6:
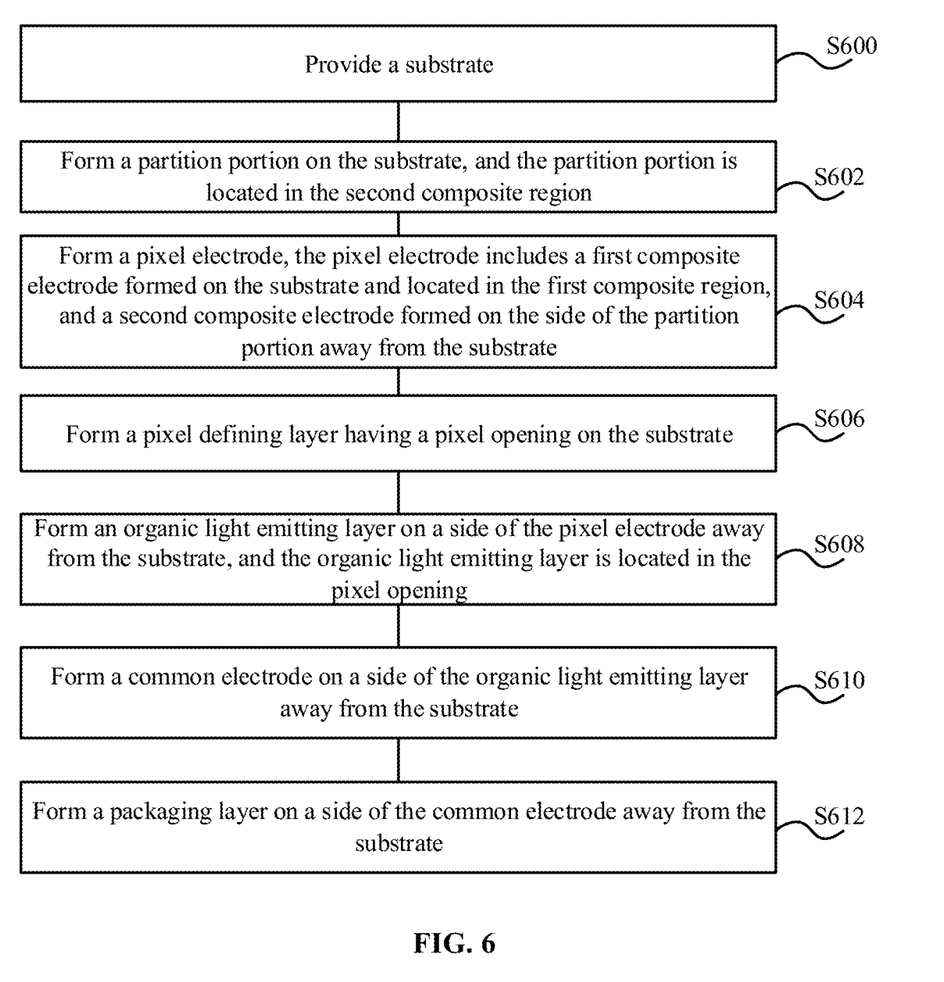
FIG. 6 shows a flowchart of the manufacturing method of an array substrate according to an embodiment of the present application.
Figure 7:
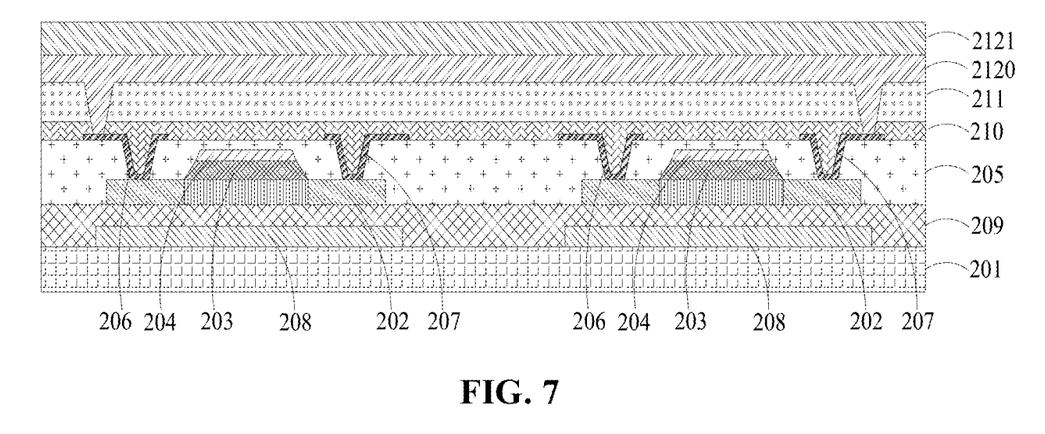
FIG. 7 is a schematic structural diagram after completing step S600.
Figure 8:
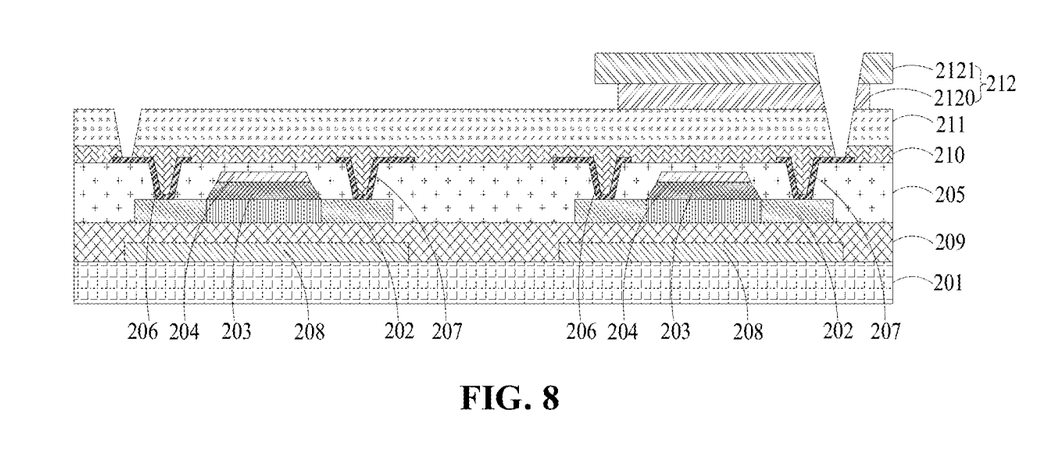
FIG. 8 shows a schematic structural diagram after completing step S602.
Figure 9:
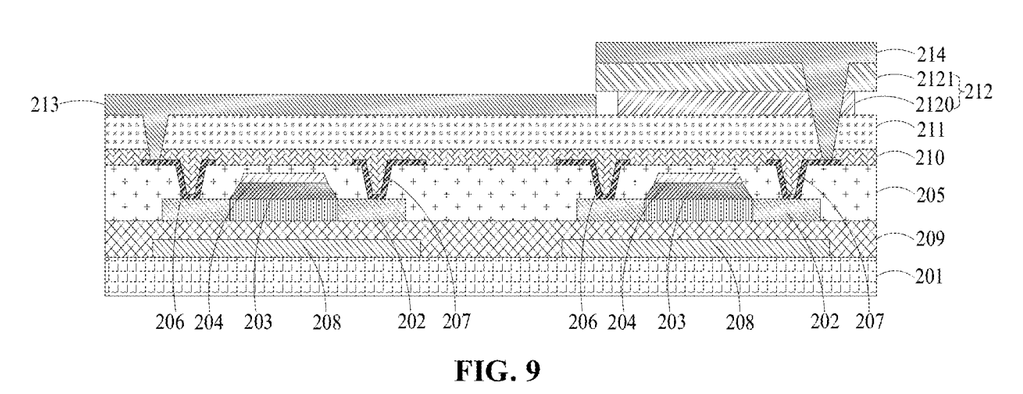
FIG. 9 shows a schematic structural diagram after completing step S604.
Figure 10:
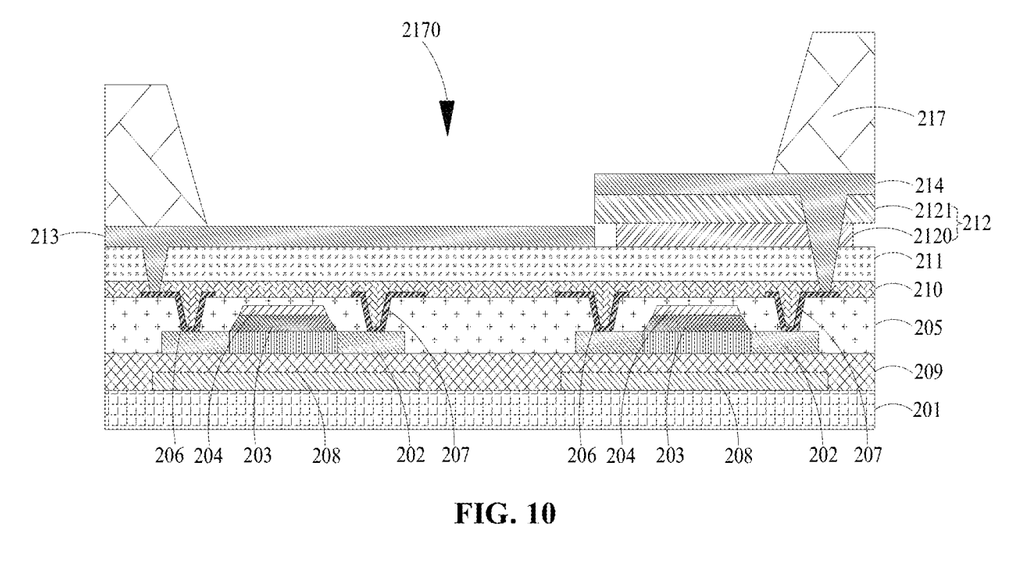
FIG. 10 shows a schematic structural diagram after completing step S606.

An embodiment of the present application also proposes a manufacturing method of the array substrate 2. The array substrate 2 may include a plurality of sub-pixels 20 arranged in an array; each sub-pixel 20 includes a first composite region and a second composite region arranged alternately. As shown in FIG. 6, the manufacturing method of the array substrate 2 may include:

providing a substrate (step S600), as shown in FIG. 7;

forming a partition portion 212 on the substrate, and the partition portion 212 is located in the second composite region (step S602), as shown in FIG. 8;

forming a pixel electrode, the pixel electrode includes a first composite electrode 213 formed on the substrate and located in the first composite region, and a second composite electrode 214 formed on the side of the partition portion 212 away from the substrate; the first composite electrode 213 and the second composite electrode 214 are disconnected from each other, and the orthographic projections of the first composite electrode 213 and the second composite electrode 214 on the substrate are seamlessly connected (step S604), as shown in FIG. 9;

forming a pixel defining layer 217 having a pixel opening 2170 on the substrate (step S606);

forming an organic light emitting layer on a side of the pixel electrode away from the substrate, and the organic light emitting layer is located in the pixel opening 2170 (step S608);

forming a common electrode 218 on a side of the organic light emitting layer away from the substrate (step S610); and forming a packaging layer 219 on a side of the common electrode 218 away from the substrate (step S612), as shown in FIG. 4.

It should be noted that the array substrate 2 described in any of the foregoing embodiments may be manufactured by using the manufacturing method of the array substrate 2, and therefore, the beneficial effects of the array substrate 2 are not described in detail here.

In the following, steps S602 and S604 are described in detail in this embodiment.

In step S602, a partition portion 212 is formed on the substrate, and the partition portion 212 is located in the second composite region. In an embodiment, the cross-section of the partition portion 212 mentioned in the foregoing embodiment is formed into a T-shape as a whole, that is, the partition portion 212 may include a first partition layer 2120 and a second partition layer 2121 sequentially stacked on the substrate; and the orthographic projection of the first partition layer 2120 on the substrate is located in the center area of the orthographic projection of the second partition layer 2121 on the substrate. In this embodiment, in order to produce the partition part 212 with T-shape section, step S602 may include:

forming a first partition layer 2120 and a second partition layer 2121 sequentially on the substrate, and the etching rate of the first partition layer is greater than the etching rate of the second partition layer 2121 (step S6020), the first partition layer 2120 and the second partition layer 2121 may be made of the material described in the forgoing embodiment.

etching the first partition layer 2120 and the second partition layer 2121 under the same etching conditions to form the partition portion 212 (step S6022).

In step S604, a pixel electrode is formed. For example, the pixel electrode may be formed by vacuum evaporation or vacuum sputtering. Since the edge of the first partition layer 2120 is retracted inwardly compared to the edge of the second partition layer 2121, that is, a recess is formed in the edge of the partition portion 212 near the substrate; accordingly, when the pixel electrode is manufactured, the pixel electrode material cannot be formed as a film at the recess, so that the pixel electrode material is naturally disconnected here, so as to form the first composite electrode 213 and the second composite electrode 214 mutually disconnected from each other. There is no need to perform a patterning process, such as exposure, development, etching, to the pixel electrodes in sub-pixel 20, thereby improving the production efficiency of the first composite electrode 213 and the second composite electrode 214.

Figure 11:
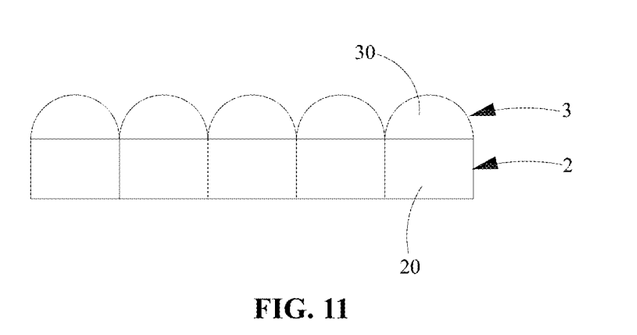
FIG. 11 is a schematic structural diagram of a three-dimensional display panel according to an embodiment of the present application.

An embodiment of the present application further provides a three-dimensional display panel, which includes the array substrate 2 according to any one of the foregoing embodiments and a lens array layer formed on a side of the packaging layer 219 away from the array substrate 2. The lens array layer can include multiple lenses 30, and each lens 30 corresponds to a sub-pixel 20. The lens array layer is configured to project the left-eye image and the right-eye image displayed in the array substrate 2 to the viewer's left eye and right eye, respectively, to form a 3D display.

An embodiment of the present application further provides a display device including the three-dimensional display panel described in the foregoing embodiment. According to the embodiment of the present application, the display device may be any product or component having a display function, such as a television, a notebook computer, a mobile phone, a head-mounted display device, an advertising machine, a light box, and the like.

An embodiment of the present application further provides a display device including the 3D display panel of the foregoing embodiment. The display device may be any product or component having a display function, such as a television, a notebook computer, a mobile phone, a head-mounted display device, an advertising machine, a light box, and the like.

According to the array substrate, the manufacturing method of the array substrate, the three-dimensional display panel, and the display device of the present application, by providing a partition portion in the sub-pixel, the pixel electrode in the sub-pixel may be divided into a plurality of disconnected composite electrodes. Since a plurality of composite electrodes are disconnected from each other, the sub-pixel may be divided into multiple composite pixels, so that a high pixels-per-inch (PPI) display may be realized. In addition, due to the setting of the partition portion, while realizing mutual disconnection between multiple composite electrodes, the orthographic projection of each composite electrode on the substrate may also be guaranteed to be seamless, that is, the orthographic projection of multiple composite pixels on the substrate may be guaranteed to be seamless, so as to improve the 3D display effect.

Although relative terms are used in this specification, such as "above" and "below" to describe the relative relationship between one component and another component of an icon, these terms are used in this specification only for convenience, for example, according to direction of the examples described. It is understood that if the device of the icon is flipped upside down, the component described as "above" will become the component described as "below." When a structure is "above" another structure, it may mean that a structure is integrally formed on another structure, or that a structure is "directly" arranged on another structure, or that a structure is "indirectly" arranged on another structure through another structure.

The terms "a/an," "the," "said," and "at least one" are used to indicate the presence of one or more elements/components and the like. The terms "include/including" and "have/having" are used to indicate an open-ended sense of inclusion and possible existence of other elements, components, and the like in addition to those listed.

Other embodiments of the present invention will be apparent to those skilled in the art from consideration of the specification and practice of the present disclosure disclosed here. The present application is intended to cover any variations, uses, or adaptations of the present invention, which are in accordance with the general principles of the invention and include common general knowledge or common technical means in the art that are not disclosed in the present invention. The specification and embodiments are deemed to be exemplary only and the true scope and spirit of this invention is indicated by the attached claims.

What is claimed is:
1. An array substrate, comprising:
a plurality of sub-pixels arranged in an array, wherein each of the sub-pixels comprises a first composite region and a second composite region arranged alternately, and each of the sub-pixels comprises:
a first substrate;
a partition portion formed on the first substrate and located in the second composite region; and
a pixel electrode comprising a first composite electrode formed on the first substrate and located in the first composite region, and a second composite electrode formed on a side of the partition portion away from the first substrate;

wherein the first composite electrode and the second composite electrode are spaced from each other by the partition portion, and an orthographic projection of the first composite electrode on the first substrate and an orthographic projection of the second composite electrode on the first substrate are seamlessly connected, wherein the orthographic projection of the second composite electrode on the first substrate overlap an orthographic projection of the partition portion on the first substrate, and wherein the partition portion comprises: a first partition layer and a second partition layer sequentially stacked on the first substrate; and an orthographic projection of the first partition layer on the first substrate is covered by an orthographic projection of the second partition layer on the first substrate.

2. The array substrate according to claim 1, wherein a distance between an edge of the first partition layer and an edge of the second partition layer is 1 μm to 5 μm.

3. The array substrate according to claim 1, wherein an etching rate of the first partition layer is greater than an etching rate of the second partition layer.

4. The array substrate according to claim 3, wherein material of the first partition layer comprises at least one of metal or resin, and material of the second partition layer comprises at least one of silicon oxide or silicon nitride.

5. The array substrate according to claim 1, wherein a thickness of the first partition layer is 50 nm to 1500 nm; and a thickness of the second partition layer is 30 nm to 1500 nm.

6. The array substrate according to claim 1, further comprising:
an organic light emitting layer formed on a side of the pixel electrode away from the first substrate;
a pixel defining layer formed on the first substrate and provided around the organic light emitting layer;
a common electrode formed on a side of the organic light emitting layer away from the first substrate; and
a packaging layer formed on a side of the common electrode away from the first substrate.

7. The array substrate according to claim 6, wherein the organic light emitting layer comprises:
a first composite light emitting portion formed on a side of the first composite electrode away from the first substrate;
a second composite light emitting portion formed on a side of the second composite electrode away from the first substrate;
wherein the first composite light emitting portion and the second composite light emitting portion are disconnected from each other, and an orthographic projection of the first composite light emitting portion on the first substrate and an orthographic projection of the second composite light emitting portion on the first substrate are seamlessly connected.

8. A method for manufacturing an array substrate that comprises a plurality of sub-pixels arranged in an array, each of the sub-pixels comprising a first composite region and a second composite region arranged alternately, the method comprising:
providing a first substrate;
forming a partition portion on the first substrate, the partition portion being located in the second composite region; and
forming a pixel electrode, the pixel electrode comprising a first composite electrode formed on the first substrate and located in the first composite region, and a second composite electrode formed on a side of the partition portion away from the first substrate; the first composite electrode and the second composite electrode being spaced from each other by the partition portion, and an orthographic projection of the first composite electrode on the first substrate and an orthographic projection of the second composite electrode on the first substrate are seamlessly connected, wherein the orthographic projection of the second composite electrode on the first substrate overlap an orthographic projection of the partition portion on the first substrate, and wherein the partition portion comprises: a first partition layer and a second partition layer sequentially stacked on the first substrate; and an orthographic projection of the first partition layer on the first substrate is covered by an orthographic projection of the second partition layer on the first substrate.

9. The method according to claim 8, wherein forming the partition portion on the first substrate comprises:
forming a first partition layer and a second partition layer on the first substrate sequentially, an etching rate of the first partition layer being greater than an etching rate of the second partition layer; and
etching the first partition layer and the second partition layer under same etching conditions to form the partition portion.

10. The method according to claim 9, wherein material of the first partition layer comprises at least one of metal or resin, and material of the second partition layer comprises at least one of silicon oxide or silicon nitride.

11. The method according to claim 9, wherein a distance between an edge of the first partition layer and an edge of the second partition layer is 1 μm to 5 μm.

12. The method according to claim 9, wherein a thickness of the first partition layer is 50 nm to 1500 nm; and a thickness of the second partition layer is 30 nm to 1500 nm.

13. The method according to claim 8, further comprising:
forming a pixel defining layer having a pixel opening on the first substrate; forming an organic light emitting layer on a side of the pixel electrode away from the first substrate, the organic light emitting layer being located in the pixel opening;
forming a common electrode on a side of the organic light emitting layer away, from the first substrate; and
forming a packaging layer on a side of the common electrode away from the first substrate.

14. The method according to claim 13, wherein forming the organic light emitting layer comprises:
forming a first composite light emitting portion on a side of the first composite electrode away from the first substrate; and
forming a second composite light emitting portion on a side of the second composite electrode away from the first substrate;
wherein, the first composite light emitting portion and the second composite light emitting portion are disconnected from each other, and an orthographic projection of the first composite light emitting portion on the first substrate and an orthographic projection of the second composite light emitting portion on the first substrate are seamlessly connected.

15. A three-dimensional display panel, comprising:
an array substrate comprising a plurality of sub-pixels arranged in an array; each of the sub-pixels comprises a first composite region and a second composite region arranged alternately, and each of the sub-pixels comprises:

a first substrate;

a partition portion formed on the first substrate and located in the second composite region; and a pixel electrode, comprising a first composite electrode formed on the first substrate and located in the first composite region, and a second composite electrode formed on a side of the partition portion away from the first substrate; the first composite electrode and the second composite electrode are spaced from each other by the partition portion, and an orthographic projection of the first composite electrode on the first substrate and an orthographic projection of the second composite electrode on the first substrate are seamlessly connected; and a lens array layer formed on a side of the sub-pixels away from the array substrate, wherein the lens array layer comprises a plurality of lenses, each of the lenses corresponds to one of the sub-pixels, and the lens array layer is configured to project a left-eye image and a right-eye image displayed by the array substrate onto left and right eyes of a viewer, respectively, wherein the orthographic projection of the second composite electrode on the first substrate overlap an orthographic projection of the partition portion on the first substrate, and wherein the partition portion comprises: a first partition layer and a second partition layer sequentially stacked on the first substrate; and an orthographic projection of the first partition layer on the first substrate is covered by an orthographic projection of the second partition layer on the first substrate.

16. The three-dimensional display panel according to claim 15, wherein the array substrate further comprises:

an organic light emitting layer formed on a side of the pixel electrode away from the first substrate;

a pixel defining layer formed on the first substrate, and provided around the organic light emitting layer;

a common electrode formed on a side of the organic light emitting layer away from the first substrate; and a packaging layer formed on a side of the common electrode away from the first substrate.

* * * * *